(12) United States Patent
Boyton

(10) Patent No.: US 6,789,042 B2
(45) Date of Patent: Sep. 7, 2004

(54) POSITION ENCODER USING STATISTICALLY BIASED PSEUDORANDOM SEQUENCE

(75) Inventor: Desmond Bruce Boyton, Ryde (AU)

(73) Assignee: Bishop Innovation Limited, North Ryde (AU)

( * ) Notice: Subject to any disclaimer, the term of this patent is extended or adjusted under 35 U.S.C. 154(b) by 0 days.

(21) Appl. No.: 10/399,470
(22) PCT Filed: Jun. 22, 2001
(86) PCT No.: PCT/AU01/00743
§ 371 (c)(1), (2), (4) Date: Apr. 18, 2003
(87) PCT Pub. No.: WO02/01160
PCT Pub. Date: Jan. 3, 2002

(65) Prior Publication Data
US 2004/0015323 A1 Jan. 22, 2004

(30) Foreign Application Priority Data
Jun. 23, 2000 (AU) .............................. PQ8351

(51) Int. Cl.⁷ .............................................. G06F 15/00
(52) U.S. Cl. .................... 702/150; 702/151; 33/1 PT
(58) Field of Search .......................... 702/150, 151; 33/1 PT

(56) References Cited

U.S. PATENT DOCUMENTS
5,235,181 A    8/1993 Durana et al.

FOREIGN PATENT DOCUMENTS
GB    2 131 163 A    6/1984
WO    WO 00/06973    2/2000

*Primary Examiner*—John Barlow
*Assistant Examiner*—Stephen Cherry
(74) *Attorney, Agent, or Firm*—Rothwell, Figg, Ernst & Manbeck, p.c.

(57) ABSTRACT

A position sensor encodes absolute position via n consecutive members of a pseudorandom sequence of bits, where each bit (30a–30k) comprises a region of high transmission or reflectivity adjacent to a region of low transmission or reflectivity. The pseudorandom sequence is chosen such that every series of n consecutive bits (30a–30k) in the sequence is predominantly formed from a predetermined bit value (1 or 0). The light transmitted or reflected from the series is therefore detected as a substantially periodic intensity pattern (42), which can be processed via Fourier analysis to yield an accurate interpolation of relative position. An example is given of a pseudorandom sequence, which can be represented as a cyclic Manchester code, in which at least 8 members of every series of 11 consecutive bits has a bit value of 1.

10 Claims, 5 Drawing Sheets

POSITION ENCODER USING STATISTICALLY BIASED PSEUDORANDOM SEQUENCE

FIELD OF INVENTION

This invention relates to a position sensor for the sensing of the absolute position of a movable body without requiring counting from a reference mark. In particular the invention relates to a barcode system where a linear array of detectors is used to read and process the absolute position of a surface to which the barcode is attached to high accuracy. The barcode is coded with values that are used to find the absolute position of the barcode marking within the length of the barcode, and has the ability to be interpolated to provide a resolution of measurement better than that of the barcode marking (or spacing) pitch, or indeed better than that of the individual detector pitch of the linear array of detectors.

BACKGROUND

Conventionally, position sensors have been used for sensing the position of a body that is movable relative to the sensor. These sensors typically consist of a detector unit and a graduated scale of material with contrasting bars formed of alternating transparent and opaque bars, or bars of alternating high and low reflectivity, the displacement of which is detected by the detector unit.

The scale is typically illuminated by a source of electromagnetic radiation (EMR), typically UV, visible or IR light, that in turn generates an image in in the form of a pattern on one or more arrays of photodetectors sensitive to the EMR. Such arrays include CCD devices, VLSI vision chips, one and two dimensional photodetector arrays and lateral effect photodiodes (commonly referred to as PSD's or position sensitive devices). The output of the one or more arrays is processed to produce a measure of the position of the movable body.

Such sensors commonly provide a signal based on the incremental position of the scale, and absolute position is determined by counting from a known reference position. The accuracy of incremental sensors is often substantially improved by the use of well known techniques such as quadrature interpolation. Such techniques generally require a non-varying bar pitch.

Alternatively, the sensor may provide a signal based on absolute position by the use of barcodes applied to the scale. These barcodes generally do not have a constant bar pitch as each set of barcodes are unique for each position to be sensed. Such absolute position sensors generally do not provide the position measurement accuracy provided by incremental sensors as they cannot use the aforementioned quadrature interpolation techniques.

If an absolute position sensor is required to have high accuracy, two separate scales and arrays of detectors are generally required. The first measures coarse absolute position by interrogation of a barcode, and the second provides a fine relative position by quadrature interpolation of a constant bar pitch pattern.

On the other hand International Patent Application No. PCT/AU99/00590 discloses the use of a single scale for the measurement of coarse absolute position and also for the fine relative position by quadrature interpolation of a regular bar pattern. The angle encoder sensor disclosed in this specification is composed of a pseudo-random bar code scale of constant bar pitch and a varying bar width or, alternatively, special forms of bar codes with varying bar pitch for coarse absolute positioning. This arrangement however has a number of disadvantages. The use of a barcode consisting of varying bar widths for coarse absolute position measurement is known to have difficulties in image processing due to the width interpretation of the barcodes due to imperfections of the individual pixels that make up the detectors in the array, and the variations in the quality of the barcode markings. Also, as the sensor requires a finite time to integrate an image, movement of the barcode relative to the sensor during this time period produces smearing of the image, further degrading the quality of the image to be processed. A further problem is the variation of the image signal produced on the array. This can be due to non-homogeneous illumination, non-homogenous surface properties, or due to the combination of the positioning of all the components that transmit, reflect or repropagate, and collect the EMR. All these effect the accuracy to which the image processing can identify the width of the individual bars of a barcode.

For the barcode of constant width but varying pitch, the image processing requires an image threshold level to be used. The setting of a single image threshold level for the entire array for the processing of the barcode has several disadvantages. The evaluation of the binary states of all of the bits incident on the array by the use of a single image threshold level is susceptible to error because the image levels on the array are due, not only to the barcode pattern, but also the effects of non-homogeneous illumination, non-homogenous surface properties, and the combination of the positioning of all the components that transmit, reflect or repropogate, and collect the EMR.

SUMMARY OF INVENTION

The present invention consists of a position sensor comprising a body at least partially surrounded by a housing, the body having a grating element attached thereto or integral therewith, the grating element comprising a surface, the surface comprising a coded distribution of regions of high and low reflectivity or transmissibility, the sensor also comprising at least one EMR source and at least one array of EMR sensitive detectors, the source irradiating the surface and the array receiving incident EMR reflected from or transmitted through the surface, the source and the array fixed with respect to the housing, a pattern thereby produced by incident EMR on the array resulting from the regions of high and low reflectivity or transmissibility on the surface of the grating element, the coded distribution having a sequence of bits, each bit comprising only one region of high reflectivity or transmissibility and only one region of low reflectivity or transmissibility, each bit representing a binary state 1 or a binary state 0 depending on whether it respectively corresponds to a transition from regions of high to low, or alternatively a transition from regions of low to high, reflectivity or transmissibility on the surface of the grating element, the bits being arranged at a substantially uniform code pitch, the incident EMR on the array therefore determining a substantially spatially periodic intensity pattern of incident EMR on the array, characterised in that the coded distribution comprises over 50% of dominant bits of either a binary state 1 or 0, and less than 50% of regressive bits, the dominant and regressive bits arranged consecutively as a pseudo-random binary code, the pseudo-random binary code sampled as a series of n consecutive bits and also determining the substantially spatially periodic intensity pattern incident on the array, the coded distribution arranged such that any said series of n consecutive bits also comprises over 50% dominant bits and less than 50% regressive bits, the pattern on the array processed by a processor to derive the absolute position of the coded distribution with respect to the housing, and hence provide a measure of the absolute position of the body with respect to the housing.

Preferably the substantially spatially periodic intensity pattern incident on the array is interpolated by Fourier analysis by the processor.

Preferably each sample of n consecutive bits is unique over the range of absolute position of the body with respect to the housing.

Preferably the transition from regions of high to low, or alternatively a transition from regions of low to high, reflectivity or transmissibility on the surface of the grating element is arranged in the form of a Manchester code.

Preferably the substantially spatially periodic intensity pattern incident on the array is processed to remove at least one regressive bit before being interpolated by Fourier analysis by the processor to further increase the accuracy of measurement of absolute position of the body with respect to the housing.

Preferably the sensitivity of the EMR sensitive detectors within the at least one array is varied according to a spatial weighting function.

Preferably the spatial weighting function is in the form of a Hanning window.

In one embodiment said body is rotatable about an axis fixed relative to said housing, and said absolute position being derived is an angular position.

In another embodiment said body is linearly movable relative to said housing, and absolute position being derived is a linear position.

Preferably the pitch of the array of EMR sensitive detectors is arranged to be smaller than the code pitch.

BRIEF DESCRIPTION OF THE DRAWINGS

The present invention will now be described by way of example with reference to the accompanying drawings, in which:

FIG. 2 is a sequence of 15 bits, of which 12 bits are dominant bits of binary state 1, and of which 3 bits are regressive bits of binary state 0;

FIG. 3b is a larger scale view of a portion of the grating element surface shown in FIG. 3a;

FIG. 4 is a sequence of 172 bits, of which 132 bits are dominant bits of binary state 1, and of which 40 bits are regressive bits of binary state 0;

FIG. 6b is a larger scale view of a portion of the grating element surface shown in FIG. 6a.

MODE OF CARRYING OUT INVENTION

Figure 1:
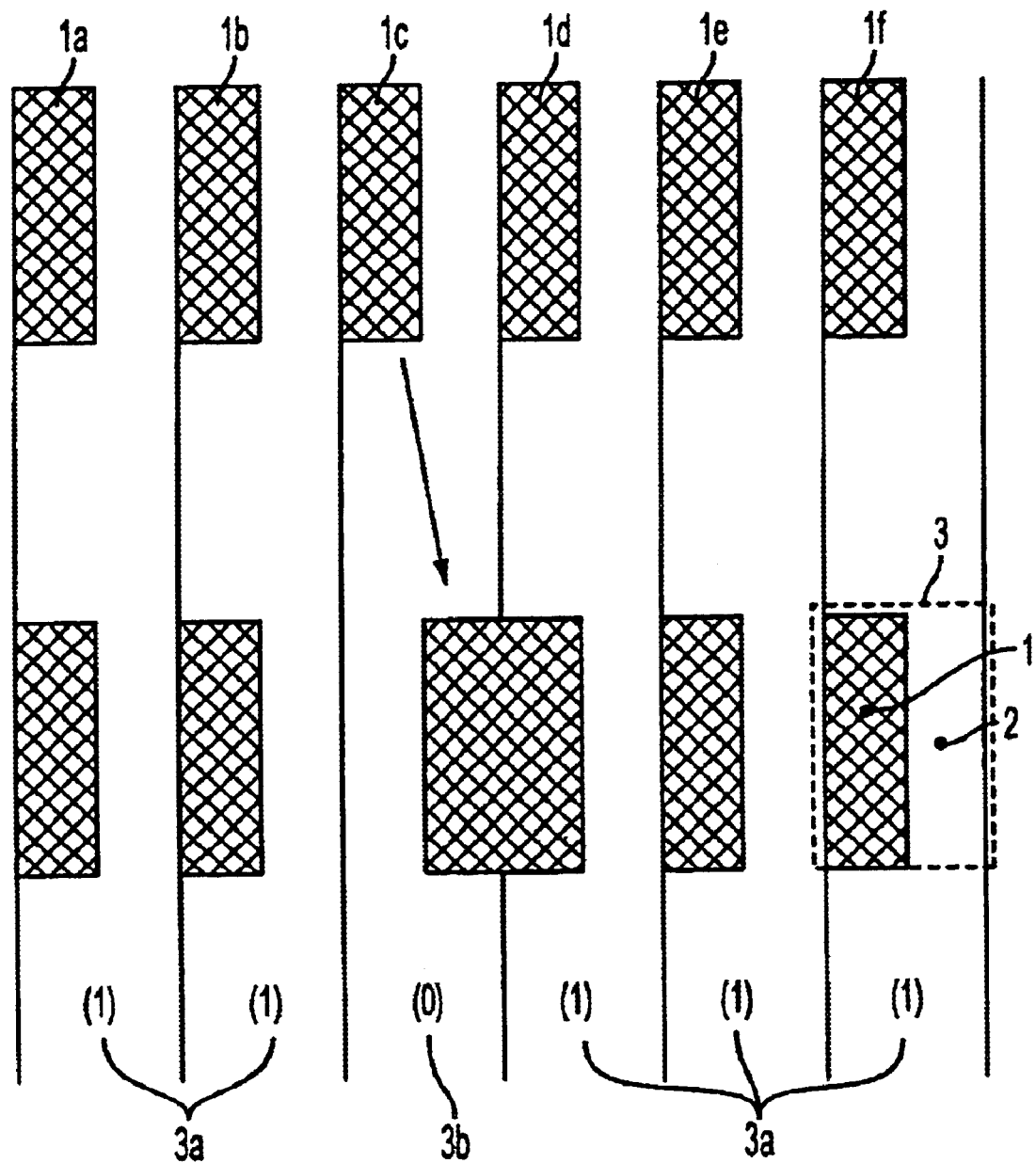
FIG. 1 is a schematic depicting the conversion of a regular 50% duty cycle coding pattern to a Manchester code.

FIG. 1 depicts how a 50% regular duty cycle coding pattern containing bars 1a–f can be modified to a Manchester code by moving one bar 1c in the pattern. The Manchester code can be disposed upon a surface such that bars 1 are of constant thickness and extend in a direction perpendicular to the intended direction of positional measurement of the barcode. The coding pattern is shown as viewed by a known array of detectors (not shown). Each bar 1 and its adjacent space 2 define a single bit 3.

The Manchester code is formed by a consecutive sequence of bits 3. In each bit 3, bar 1 comprises of a region of low reflectivity or transmissibility and adjacent space 2 is of a region of high reflectivity or transmissibility. Over the whole of the Manchester code comprising 6 bits, one regressive bit 3b is of binary state (0). The remaining five dominant bits 3a are of binary state (1).

FIG. 2 depicts a sequence of 15 bits, of which 12 bits are dominant bits of binary state (1), and of which 3 bits are regressive bits of binary state (0). In this sequence of 15 bits, the number of bits of binary state (1) is substantially larger than 50%, whilst the number of bits of binary state (0) is substantially lower than 50%. If a detector array (not shown), capable of viewing only 6 sequential bits at any instant, detects the first 6 bits (reading left to right) in FIG. 2, the code sequence is identical to that shown in FIG. 1.

Where the detector array views any sequence of 6 consecutive bits from FIG. 2, the sequence is unique and not repeated anywhere over the length of that code corresponding to the range of absolute position of the body to which the barcode is attached. As in the case of the lefthand most 6 sequential bits which have the number of binary states (1) larger than 50%, any other 6 sequential bits also contain a number of binary states (1) larger than 50%.

Figure 3A:
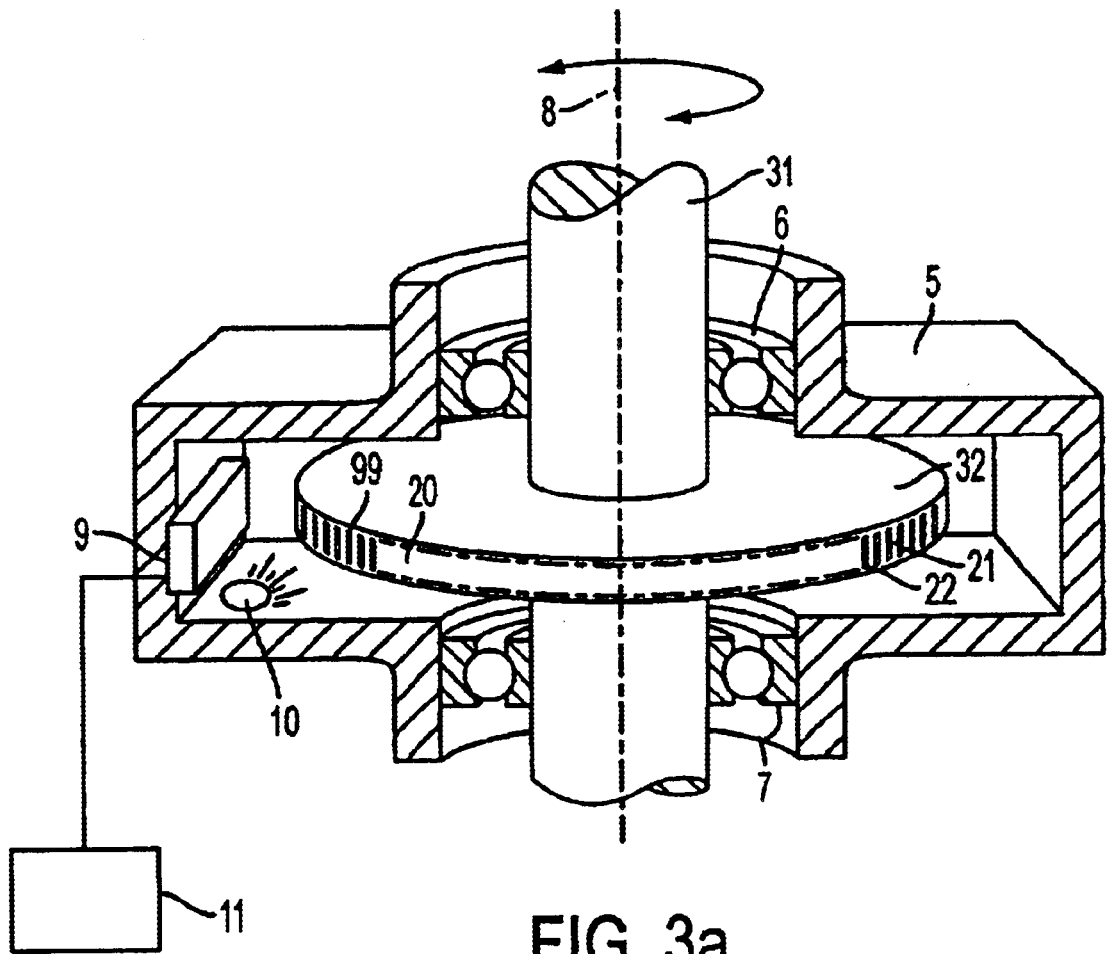
FIG. 3a is a diagrammatic sectional view of an angular position sensor according to a first embodiment of the present invention showing a rotatable body consisting of a cylindrically arranged grating element surface with regions of high and low reflectivity and a radially disposed photodetector array.
Figure 3B:
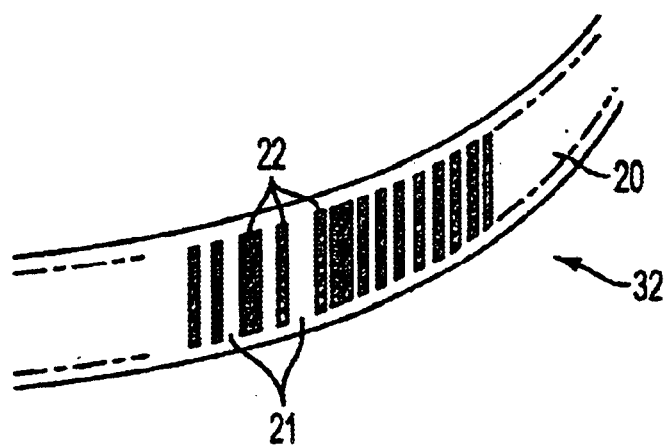

FIGS. 3a & 3b show an angular position sensor according to a first embodiment of the present invention. Grating element 32 of rotatable body 31 comprises a continuous cylindrical surface 20 on which there is marked a coded distribution 99 composed of alternating regions of high and low EMR reflectivity, arranged in the form of a succession of individual binary barcodes. A metallised coating, or other shiny or light coloured material or surface treatment, provides substantially axially aligned regions of high reflectivity 21. A substantially transparent, roughened or dark coloured material or surface treatment provides the interspaced regions of low reflectivity 22. Rotatable body 31 is enclosed in housing 5 and supported in bearings 6 and 7, and is able to rotate about axis of rotation 8. EMR source 10 and EMR sensitive photodetector array 9 are fixed in housing 5 and arranged such that EMR source 10 illuminates the regions of high and low reflectivity 21 and 22 which re-radiates EMR to the substantially radially disposed array 9. Thus a pattern is produced on array 9, which is processed by processor 11 to provide a measure of the absolute angular position of rotatable body 31 with respect to housing 5.

FIG. 4 depicts a 172 bit sequence, of which 132 bits are dominant bits of binary state (1) and of which 40 bits are regressive bits of binary state (0). This particular bit sequence can be represented as a Manchester code and used as the coded distribution 99 on surface 20 of grating element 32 of the angular position sensor shown in FIGS. 3a and 3b. Coded distribution 99, which is made up of the whole 172 bit sequence, extends a full 360° around grating element 32.

The last bit of the 172 bit sequence is adjacent to the first bit of the 172 bit sequence, so that the coded distribution 99 is a continuous barcode sequence. The pattern produced on array 9 from imaging any 11 consecutive bits in this continuous 172 bit sequence is unique, and does not occur anywhere else in the barcode sequence. Also, at least 8 bits out of any consecutive 11 bits are dominant bits of binary state (1) while no more than 3 bits out of any consecutive 11 bits from the sequence are regressive bits of binary state (0).

Figure 5:
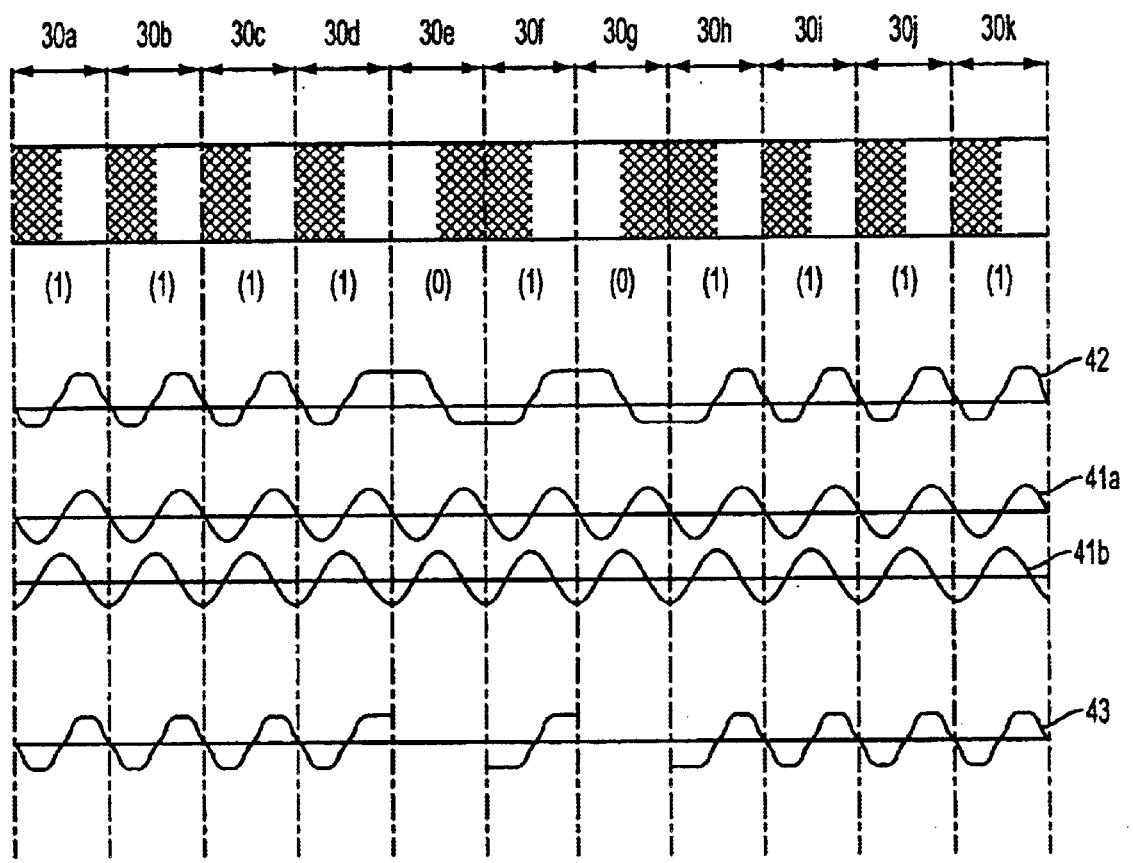
FIG. 5 is a diagram illustrating the pattern produced by incident EMR on the photodetector array and a technique employed in the position sensor according to the present invention to provide both coarse resolution absolute angle measurement and fine resolution interpolated measurement.

FIG. 5 shows an example of a pattern produced by incident EMR on array 9 according to the first embodiment of the present invention. The individual bits 30a–k represent 11 sequential bits of the pattern 42 on array 9. This array is adapted to provide both an absolute angular position measurement and a fine resolution angular position measurement. The absolute angular position measurement is performed by the reading of at least 11 bits so as to permit the identification of a unique angular position of rotatable body 31.

Array 9 has pixels that are spaced at a pitch substantially smaller than half the code pitch (ie. width of each bar) of coded distribution 99 and the detected image is therefore oversampled and so the processing of the bit patterns 30a–k does not depend on any one pixel. As conventional array pixels are known to vary in sensitivity, this allows for the position sensor to work with non-optimal pixel quality. Also the over-sampling of the image provides higher resolution position measurement.

The processing of the bit patterns is achieved by conventional Fourier analysis interpolation using 2 weighting functions 41a and 41b. Because the incorporation of regressive bits 3b reduces the signal away from the optimal regular 50% duty cycle (as shown in FIG. 1), the Fourier analysis interpolation accuracy will be slightly reduced accordingly. In practise, the interpolation by electronics is found to be of a higher accuracy than that of the mechanical parts, and so this reduction of the positional accuracy is found to be of little significance when compared to the mechanical run-out of rotatable body 31 in bearings 6 and 7. Also, after the measurement is taken, the regressive bits 3b can be excluded from pattern 42 to produce a second pattern 43 consisting only of dominant bits 3a. A Fourier analysis interpolation is then performed on the pattern 43 which provides a measurement based on a higher signal to noise ratio, increasing the interpolation accuracy.

The end effect conditions are known to reduce the accuracy of the Fourier analysis interpolation, hence spatial weighting function methods such as Hanning window scaling of array 9 can be used to vary the sensitivity of the EMR sensitive detectors and hence reduce the end effects due to bits 30a and 30k.

By imaging and processing the information from 11 consecutive bits from the 172 bit sequence, and providing 128 positions/bit Fourier analysis interpolation, the absolute position of array 9 relative to the coded distribution 99 can be resolved to 22016 angular positions per revolution (i.e. 0.016° resolution).

The Fourier analysis interpolation used to produce the high level of interpolation is as follows:

If the EMR intensity pattern is sinusoidal, then:

$$P(x)=\sin[2n(x-d)/a]$$

Where
a=pitch of the pattern, and
d=displacement of the pattern

The pattern P(x) is sampled by the individual pixels of array 9. Let $P_i$ denote the i-th sample. Thus the "pattern vector" of n samples can be denoted as $P=[P_1, P_2, P_3, \ldots P_n]$.

The two weighting functions 41a and 41b are now defined, being the sine and cosine weighting vectors:

$$K_{1i}=\sin(2ni/a) \text{ for } i=1 \ldots n$$

$$K_{2i}=\cos(2ni/a) \text{ for } i=1 \ldots n$$

Hence phase angle α is given by:

$$\alpha=\arctan[(\Sigma P_i K_{1i})/(\Sigma P_i K_{2i})] \text{ for } i=1 \ldots n$$

The resulting phase angle α is a measure of the displacement of the pattern relative to the sine and cosine weighting vectors and provides a fine resolution position measurement that is of many times greater resolution than the width of one bit of the pattern. This process also produces similar results for spatially periodic or at least substantially spatially periodic EMR intensity patterns.

Using this technique the coarse resolution absolute angular position measurement and fine resolution incremental angular position measurement is combined to provide an absolute angular position measurement technique with fine resolution requiring only one detector array in the sensor and with low susceptibility to mechanical manufacturing tolerances.

Figure 6A:
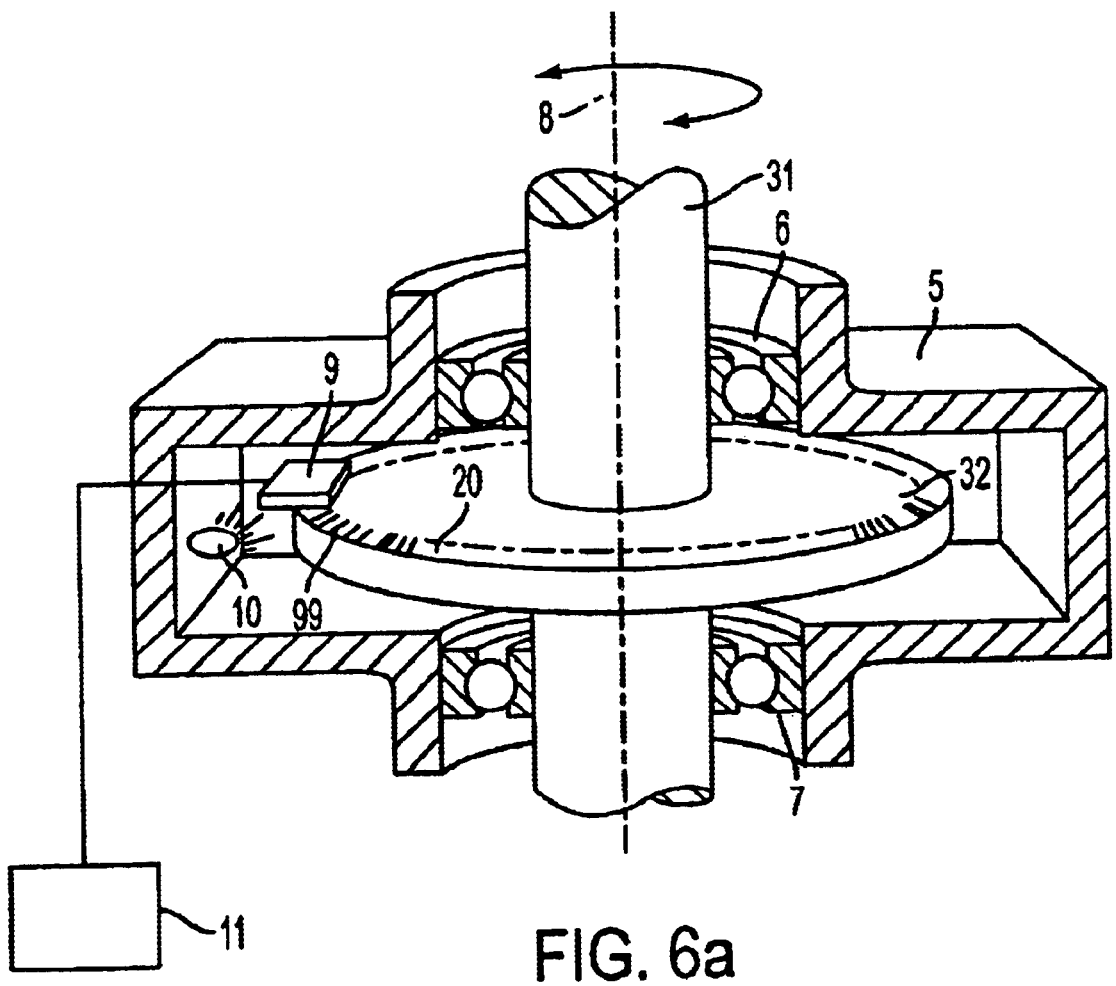
FIG. 6a is a diagrammatic sectional view of an angular position sensor according to a second embodiment of the present invention showing a disc shaped grating element surface with an axially disposed photodetector array.
Figure 6B:
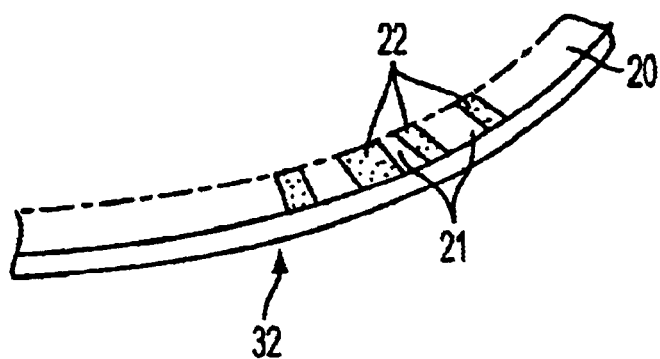

FIGS. 6a & 6b show an alternative angular position sensor according to a second embodiment of the present invention. In this embodiment, grating element 32 of rotatable body 31 comprises a flat disk surface 20 on which is marked coded distribution 99, rather than a continuous cylindrical surface as depicted in the first embodiment shown in FIG. 3. In such an embodiment coded distribution 99 comprises a 172 bit sequence in a similar manner to that of the first embodiment.

In a further not shown embodiment, a linear position sensor may utilise a Manchester code comprising over 50% dominant bits of binary state (1) and less than 50% regressive bits of binary state (0) as described with reference to FIGS. 1, 2, 4 and 5.

It will be appreciated by those skilled in the art that numerous variations and modifications may be made to the invention without departing from the spirit and scope of the invention.

What is claimed is:

1. A position sensor comprising a body at least partially surrounded by a housing, the body having a grating element attached thereto or integral therewith, the grating element comprising a surface, the surface comprising a coded distribution of regions of high and low reflectivity or transmissibility, the sensor also comprising at least one EMR source and at least one array of EMR sensitive detectors, the source irradiating the surface and the array receiving incident EMR reflected from or transmitted through the surface, the source and the array fixed with respect to the housing, a pattern thereby produced by incident EMR on the array resulting from the regions of high and low reflectivity or transmissibility on the surface of the grating element, the coded distribution having a sequence of bits, each bit comprising only one region of high reflectivity or transmissibility and only one region of low reflectivity or transmissibility, each bit representing a binary state 1 or a binary state 0 depending on whether it respectively corresponds to a transition from regions of high to low, or alternatively a transition from regions of low to high, reflectivity or transmissibility on the surface of the grating element, the bits being arranged at a substantially uniform code pitch, the incident EMR on the array therefore determining a substantially spatially periodic intensity pattern of incident EMR on the array, characterised in that the coded distribution comprises over 50% of dominant bits of either a binary state 1 or 0, and less than 50% of regressive bits, the dominant and regressive bits arranged consecutively as a pseudo-random binary code of length m, the pseudo-random binary code sampled as a series of n consecutive bits, wherein m and n are integers greater than one, and m is greater than n, and also determining the substantially spatially periodic intensity pattern incident on the array, the coded distribution arranged such that any said series of n consecutive bits also comprises over 50% dominant bits and less than 50% regressive bits, the pattern on the array processed by a processor to derive the absolute position of the coded distribution with respect to the housing, and hence provide a measure of the absolute position of the body with respect to the housing.

2. A position sensor as claimed in claim 1, wherein the substantially spatially periodic intensity pattern incident on the array is interpolated by Fourier analysis by the processor.

3. A position sensor as claimed in claim 1, wherein each sample of n consecutive bits is unique over the range of absolute position of the body with respect to the housing.

4. A position sensor as claimed in claim 1, wherein the transition from regions of high to low, or alternatively a transition from regions of low to high, reflectivity or transmissibility on the surface of the grating element is arranged in the form of a Manchester code.

5. A position sensor as claimed in claim 1, wherein the substantially spatially periodic intensity pattern incident on the array is processed to remove at least one regressive bit before being interpolated by Fourier analysis by the processor to further increase the accuracy of measurement of absolute position of the body with respect to the housing.

6. A position sensor as claimed in claim 1, wherein the sensitivity of the EMR sensitive detectors within the at least one array is varied according to a spatial weighting function.

7. A position sensor as claimed in claim 6, wherein the spatial weighting function is in the form of a Hanning window.

8. A position sensor as claimed in claim 1, wherein said body is rotatable about an axis fixed relative to said housing, and said absolute position being derived is an angular position.

9. A position sensor as claimed in claim 1, wherein said body is linearly movable relative to said housing, and absolute position being derived is a linear position.

10. A position sensor as claimed in claim 1, wherein the pitch of the array of EMR sensitive detectors is arranged to be smaller than the code pitch.

* * * * *